United States Patent
Osanai et al.

(10) Patent No.: US 7,131,483 B2
(45) Date of Patent: Nov. 7, 2006

(54) APPARATUS, MOLD, AND METHOD FOR MANUFACTURING METAL-CERAMIC COMPOSITE MEMBER

(75) Inventors: Hideyo Osanai, Tokyo (JP); Susumu Ibaragi, Tokyo (JP); Makoto Namioka, Tokyo (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/659,305

(22) Filed: Sep. 11, 2003

(65) Prior Publication Data

US 2004/0123968 A1 Jul. 1, 2004

(30) Foreign Application Priority Data

Sep. 13, 2002 (JP) ............................. 2002-268100

(51) Int. Cl.
*B22D 18/02* (2006.01)
(52) U.S. Cl. ...................... 164/419; 164/461
(58) Field of Classification Search ............... 164/461, 164/419, 487
See application file for complete search history.

(56) References Cited

U.S. PATENT DOCUMENTS

| | | | | |
|---|---|---|---|---|
| 3,842,896 A | * | 10/1974 | Dobo | 164/461 |
| 5,752,563 A | * | 5/1998 | Ollman | 164/98 |
| 6,035,925 A | * | 3/2000 | Blucher | 164/419 |
| 6,209,620 B1 | * | 4/2001 | Pleschiutschnigg | 164/461 |
| 6,660,088 B1 | * | 12/2003 | Negishi et al. | 118/405 |
| 6,705,384 B1 | * | 3/2004 | Kilmer et al. | 164/461 |
| 6,736,187 B1 | * | 5/2004 | Kamata | 164/102 |

FOREIGN PATENT DOCUMENTS

| | | |
|---|---|---|
| CH | 416 428 A | 6/1966 |
| EP | 1 400 500 B1 | 5/2006 |
| GB | A-1211945 | 11/1970 |
| JP | A 7-276035 | 10/1995 |
| JP | A 8-215828 | 8/1996 |
| JP | A 9-315875 | 12/1997 |
| JP | A 11-226717 | 8/1999 |
| JP | A 2001-144224 | 5/2001 |
| JP | A 2002-76551 | 3/2002 |

* cited by examiner

*Primary Examiner*—Len Tran
(74) *Attorney, Agent, or Firm*—Oliff & Berridge, PLC

(57) ABSTRACT

A manufacturing apparatus capable of manufacturing metal-ceramic composite members in various shapes with high productivity, and a mold member and a manufacturing method therefor. An apparatus for manufacturing a metal-ceramic composite member has a plurality of process regions, namely, an atmosphere replacing/heating part, a molten metal push-out part, and a cooling part; and a guide for allowing a mold to pass through these plural process regions. The molds have ceramic members placed therein and are successively inserted into a mold inlet provided in the guide to pass through the guide practically in a shielded state from the atmosphere. A molten metal is poured thereto in the molten-metal push-out part, and the molten metal is cooled and solidified in the cooling part to join a metal and a ceramic, thereby manufacturing the metal-ceramic composite member.

3 Claims, 8 Drawing Sheets

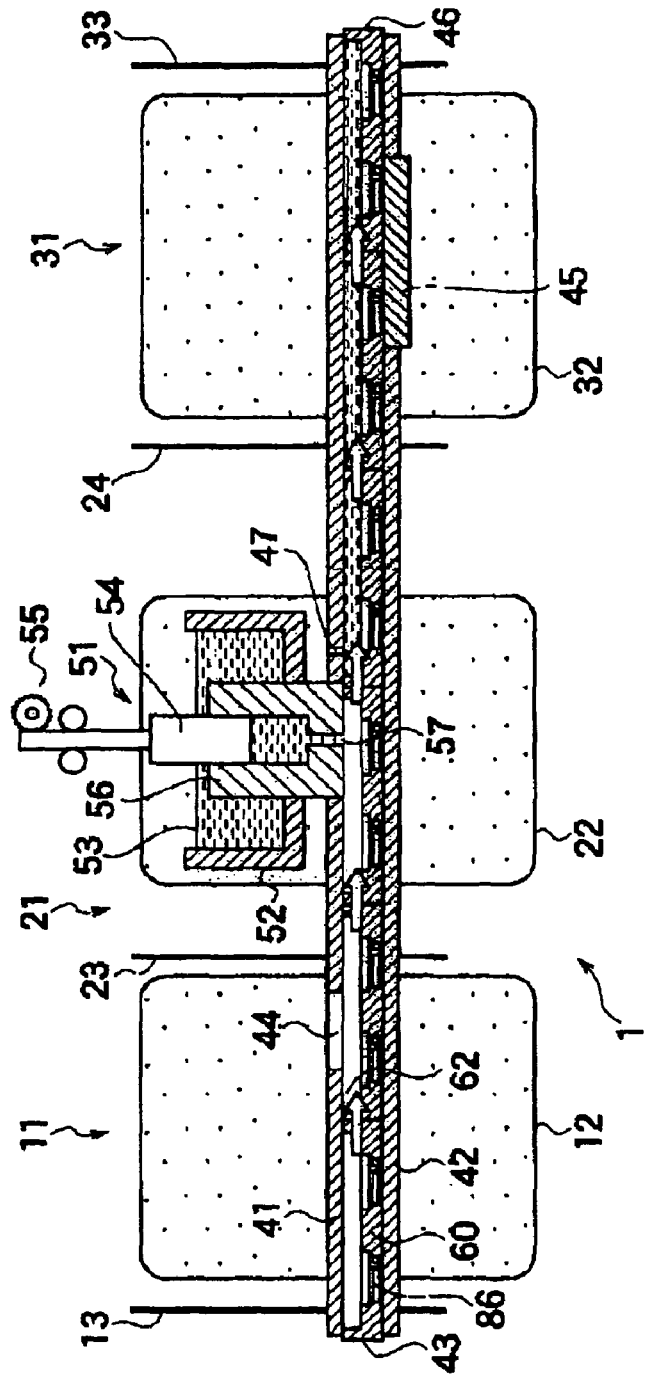
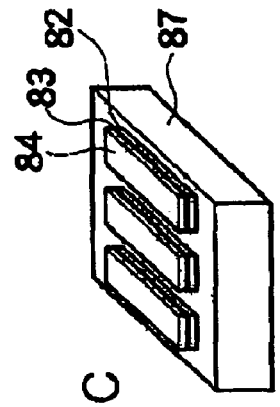
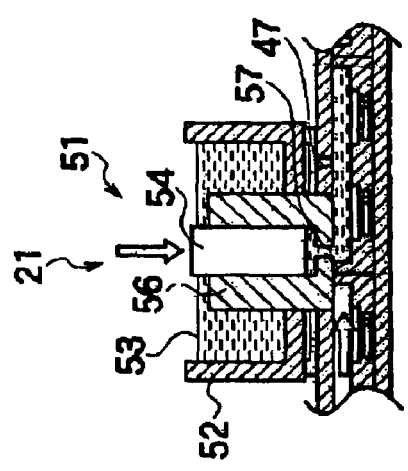
FIG.4A
FIG.4B
FIG.4C

APPARATUS, MOLD, AND METHOD FOR MANUFACTURING METAL-CERAMIC COMPOSITE MEMBER

BACKGROUND OF THE INVENTION

1. Field of the Invention

The present invention relates to an apparatus, a mold, and a method for manufacturing a metal-ceramic composite member in which a ceramic and a metal are firmly joined together by a direct joining strength on an interface therebetween, and further relates to an electronic member formed by mounting electronic devices on the manufactured metal-ceramic composite member.

2. Description of the Related Art

Metal-ceramic composite members taking advantages of characteristics of ceramic such as chemical stability, high melting point, insulation performance, high hardness, and relatively high thermal conductivity and characteristics of metal such as high strength, high toughness, easy workability, and electrical conductivity are in wide use for automobiles, electronic equipment, and so on, and typical examples thereof are metal-ceramic composite substrates and packages for automobile turbocharger rotors and for mounting high-power electronic elements.

As methods for manufacturing the metal-ceramic composite members, adhesive bonding, plating, metallization, thermal spraying, internal chill, brazing, and a DBC method are well known in the art, and as for metal-ceramic composite substrates among the metal-ceramic composite members, most of them have recently been manufactured by the DBC method using alumina substrates and a metal active brazing method using aluminum nitride substrates in view of cost problem.

This applicant has proposed a method and an apparatus for directly joining aluminum as a metal member to a ceramic member, and a mold therefor (for example, refer to Patent documents 1 to 3).

(Patent document 1)
Japanese Patent Laid-open No. Hei 07-276035
(Patent document 2)
Japanese Patent Laid-open No Hei 11-226717
(Patent document 3)
Japanese Patent Laid-open No. 2002-76551

Recently, in accordance with the expansion of the market for metal-ceramic composite members, there has been an increasing demand for the supply of metal-ceramic composite members in various shapes at low cost. There are some cases, however, where the aforesaid proposals cannot always fully respond to such a demand.

For example, when a metal-ceramic composite member, which is shown in, for example, FIG. 4C, FIG. 7, or FIG. 9, being so structured that a plurality of ceramic substrates are joined onto a joining metal is to be produced through the use a vertical-type mold according to the prior art in which the ceramic substrates are placed vertically, the ceramic substrates are given considerable buoyancy due to a poured molten metal to become unstable. Consequently, the position and posture of the ceramic substrates in the mold fluctuate even with a slight shock accompanying the pouring of the molten metal and the movement of the mold, which has been an obstacle to the manufacture of a desired metal-ceramic composite member. It might be possible as a method for solving this problem to provide a jig in the vertical-type mold so as to prevent the fluctuation in the position and posture that is caused by the floating of the ceramic substrates, but this method had to be given up due to the complication of the internal structure of the mold, the possibility that materials constituting the jig may become new contaminating sources, and so on.

SUMMARY OF THE INVENTION

The present invention is made in view of the problem stated above, and it is an object of the present invention to provide a manufacturing apparatus that is capable of manufacturing metal-ceramic composite members in various shapes with high productivity, and a mold member and a manufacturing method therefor, and further to provide an electronic member that is formed by mounting electronic devices on the manufactured metal-ceramic composite member.

A first invention to solve the problem stated above is an apparatus for manufacturing a metal-ceramic composite member that joins metal onto a surface of a ceramic member by a direct joining strength of a ceramic and a metal on an interface therebetween in such a manner that the ceramic member is placed in a mold member, a molten metal to be joined is poured into the mold member so as to come into contact with the surface of the ceramic member, and the molten metal is cooled and solidified, and the manufacturing apparatus comprises:

a plurality of process regions; and a passage member extending along the plural process regions, that allows the mold member to pass therethrough, wherein the molten metal to be joined is poured while the mold member is passing through the passage member practically in a shielded state from the atmosphere.

When the above-described structure is adopted, since heating, molten metal pouring, and cooling can be performed while the mold member having the ceramic member placed therein is passing through the passage member practically in the shielded state from the atmosphere, the plural mold members contiguous to one another can pass through the passage member, and in addition, the molten metal to be joined is poured into the mold member, so that the time for melting the metal is not required, and the mold member itself can be downsized, resulting in the reduction in the heating time and the cooling time. Consequently, productivity of the metal-ceramic composite member has been greatly improved.

According to a second invention, in the apparatus for manufacturing the metal-ceramic composite member according to the first invention, the mold member is held tightly by the passage member.

When the above-described structure is adopted, the position of the mold member in the manufacturing apparatus of the metal-ceramic composite member can be controlled, and the mold member and the passage member work in cooperation to generate a resisting force against a camber that occurs when the molten metal is cooled and solidified. Consequently, the mold member can be downsized.

According to a third invention, in the apparatus for manufacturing the metal-ceramic composite member according to the first or the second invention, a predetermined amount of the molten metal to be joined is poured to the mold member by pressure.

When the above-described structure is adopted, the predetermined amount of the molten metal to be joined is poured to the mold member by pressure, so that the pouring time is reduced and the molten metal can be poured into the mold member, leaving no space unfilled. This has improved productivity and moldability of the metal-ceramic composite member.

According to a fourth invention, in the apparatus for manufacturing the metal-ceramic composite member according to any one of the first to the third invention, the molten metal to be joined is made to flow while being in contact with the mold member and poured so as to come into contact with the surface of the ceramic member.

When the above-described structure, in which the molten metal to be joined is made to flow while being in contact with the mold member, is adopted, a metal oxide on a surface of the molten metal to be joined adheres to the mold member, or is taken into an inner part of the molten metal to be removed from the surface of the molten metal, and when this molten metal having no metal oxide on the surface thereof is brought into contact with the surface of the ceramic member, the decrease in the metal-ceramic joining strength can be avoided since the metal oxide does not exist on the metal-ceramic interface.

A fifth invention is a mold member according to any one of the first to the fourth invention, and the ceramic member is placed horizontally in a mounting portion in the mold member, utilizing a self-weight of the ceramic member.

When the above-described structure is adopted, the ceramic member lying horizontally in the mounting portion in the mold member is placed stably in the mold member owing to the self-weight thereof, so that the position and posture thereof are not fluctuated even when it is given buoyant from the molten metal that is poured with an area larger than the surface area of the ceramic member. This has made it possible to manufacture a desired metal-ceramic composite member.

A sixth invention is a mold member according to any one of the first to the fifth invention, and it comprises a shrinkage cavity inducing portion provided in the mold member, that causes a shrinkage cavity of the metal to be generated therein when the molten metal is cooled.

When the above-described structure is adopted, the shrinkage cavity, which is -generated when the poured molten metal is cooled, is induced to and generated in the shrinkage cavity inducing portion. This has made it possible to manufacture the metal-ceramic composite member without any shrinkage cavity in a product portion.

A seventh invention is a method for manufacturing a metal-ceramic composite member, and the method comprises: placing a ceramic member in a mold member; pouring a molten metal to be joined into the mold member so as to bring the molten metal into contact with a surface of the ceramic member; and cooling and solidifying the molten metal to join the metal onto the surface of the ceramic member by a direct joining strength of the ceramic and the metal on an interface therebetween, wherein the molten metal to be joined is poured while the mold member is passing through a passage member extending along a plurality of process regions, practically in a shielded state from the atmosphere.

When the above-described structure is adopted, since heating, molten metal pouring, and cooling are performed while the mold member having the ceramic member placed therein is passing through the passage member practically in the shielded state from the atmosphere, the plural mold members contiguous to one another can pass through the passage member, and in addition, the molten metal to be joined is poured into the mold member, so that the time for melting the metal is not required, and the mold member itself is downsized, resulting in the reduction in the heating time and the cooling time. This has greatly improved productivity of the metal-ceramic composite member.

According to an eighth invention, in the method for manufacturing the metal-ceramic composite member according to the seventh invention, the solidification is made to progress in one direction when the molten metal is cooled and solidified.

The adoption of the above-described structure realizes uniform crystal structure of the metal that is the cooled and solidified molten metal, resulting in excellent electrical characteristics and etching characteristics, and also resulting in a uniform and firm metal-ceramic joining strength in the ceramic member.

According to a ninth invention, in the method for manufacturing the metal-ceramic composite member according to the seventh or the eighth invention, the metal is aluminum or an alloy essentially consisting of aluminum, and the ceramic member is any one of an oxide, a nitride, and a carbide of aluminum, and an oxide, a nitride, and a carbide of silicon.

The adoption of the above-described structure has made it possible to obtain a sufficient joining strength on the metal-ceramic interface, and further to manufacture a widely applicable metal-ceramic composite member that has, as its constituent members, a metal high in electrical conductivity and thermal conductivity and a ceramic high in electrical insulatability and thermal conductivity.

A tenth invention is a metal-ceramic composite member manufactured by a method for manufacturing a metal-ceramic composite member according to any one of claim 7 to claim 9, and it comprises:

a ceramic member; and metal members or metal plates joined onto both sides of the ceramic member, wherein the metal member or metal plate on one side of the ceramic member is patterned into a wiring material and an electronic device is disposed thereon, and the metal member or metal plate on the other side of the ceramic member serves as a heat sink plate or a heat release fin.

BRIEF DESCRIPTION OF THE DRAWINGS

FIG. 4A and FIG. 4B are vertical sectional views showing steps of manufacturing the metal-ceramic composite member:

FIG. 4C is a perspective view of an example of a metal-ceramic composite member that is manufactured;

DETAILED DESCRIPTION OF THE PREFERRED EMBODIMENTS

Hereinafter, embodiments of the present invention will be explained using FIG. 1 to FIG. 4C.

Figure 1:
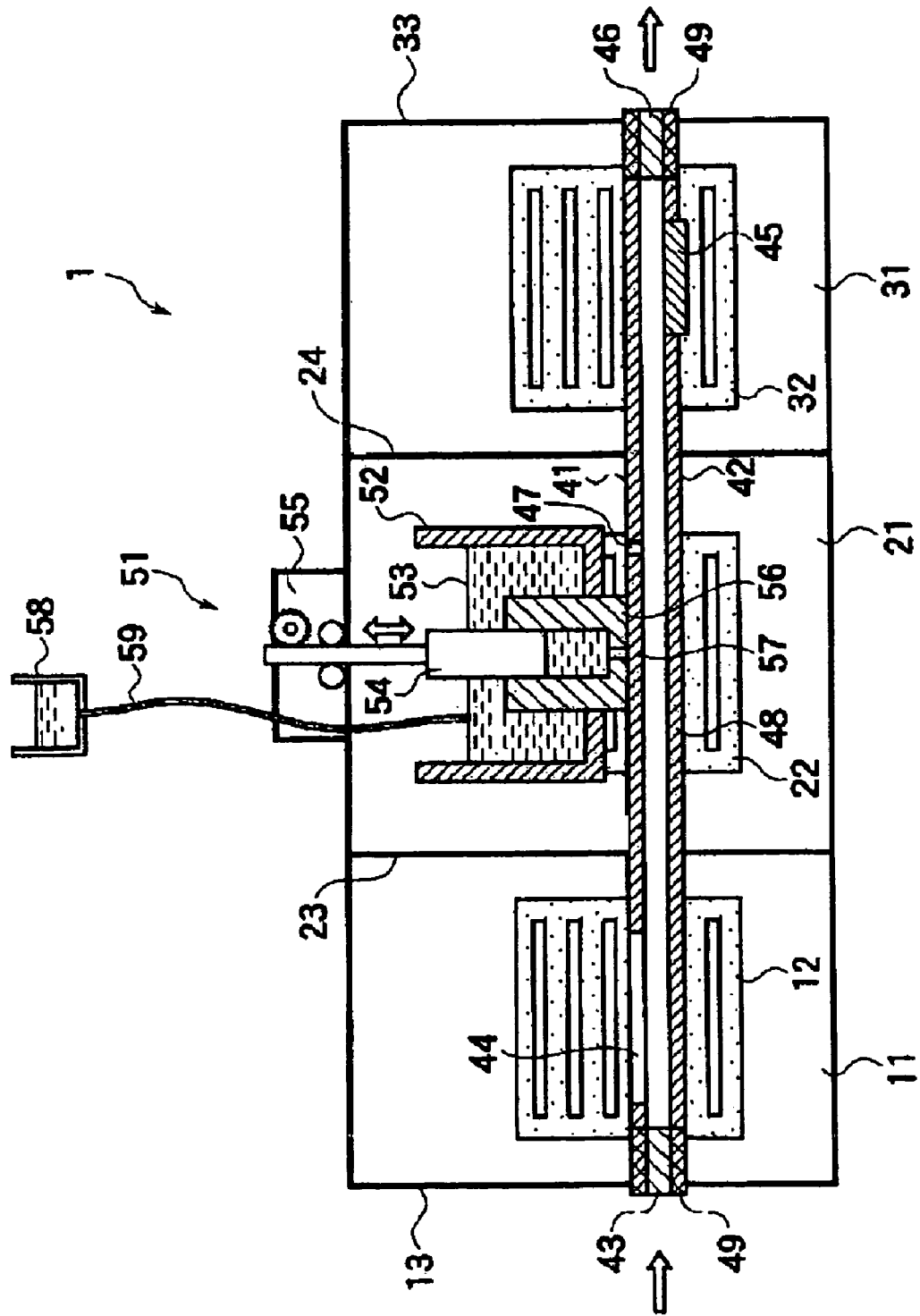
FIG. 1 is a vertical sectional view of an example of an apparatus for manufacturing a metal-ceramic composite member according to the present invention.

Here, FIG. 1 is a vertical sectional view showing an example of a manufacturing apparatus of a metal-ceramic composite member according to the present invention, FIG. 2A is a perspective view of an example of a mold member according to the present invention, FIG. 2B is a cross sectional view of the example of the mold member according to the present invention, taken along the A—A line, FIG. 2C and FIG. 2D are cross sectional views taken along the B—B line when the mold member passes through the inside of a passage member provided in the manufacturing apparatus, FIG. 3A to FIG. 3E are vertical sectional views showing steps from manufacturing a ceramic member and up to placing the manufactured ceramic member in the mold member shown in FIG. 2A, FIG. 4A and FIG. 4B are vertical sectional views of essential parts of FIG. 1, in which the mold member is added in order to show the step of manufacturing the metal-ceramic composite member through the use of the manufacturing apparatus of the metal-ceramic composite member shown in FIG. 1 by pouring a molten metal to be joined into the mold member in which the ceramic member is placed, and FIG. 4C is a perspective view of an example of the metal-ceramic composite member manufactured in this step.

A joining furnace that is a manufacturing apparatus of a metal-ceramic composite member according to the present invention will be explained first using FIG. 1.

In FIG. 1, a joining furnace 1 is a furnace for joining a metal member onto a ceramic member by pouring a molten metal into a mold member (not shown) having the ceramic member placed therein and by cooling the molten metal thereafter. This joining furnace 1 is composed of: an atmosphere replacing/heating part 11 that is a process region where an atmosphere in the mold member is replaced with an inert gas atmosphere, and thereafter, the mold member is heated; a molten-metal push-out part 21 that is a process region where the temperature of the mold member having heated in the atmosphere replacing/heating part 11 is maintained at a pouring temperature and in this state, a molten metal 53 to be joined (hereinafter, referred to simply as a molten metal) is poured into the mold member; and a cooling part 31 that is a process region where the temperature inside the mold member to which the molten metal has been poured in the molten-metal push-out part 21 is cooled to thereby joining the metal to the ceramic member.

These atmosphere replacing/heating part 11, molten-metal push-out part 21, and cooling part 31 are arranged in a line in a horizontal direction. A first partition wall 13 is interposed between the external environment and the atmosphere replacing/heating part 11, a second partition wall 23 is interposed between the atmosphere replacing/heating part 11 and the molten-metal push-out part 21, a third partition wall 24 is interposed between the molten-metal push-out part 21 and the cooling part 31, and a fourth partition wall is interposed between the cooling part 31 and the external environment. Further, an atmosphere replacing/heating part heater 12, a molten-metal push-out part heater 22, and a cooling part heater 32 as heating units and temperature controllers are provided on sidewalls of the atmosphere replacing/heating part 11, the molten-metal push-out part 21, and the cooling part 31, so that the temperature of the mold member placed in each chamber can be appropriately controlled. A cooling jacket 45 as a cooling unit for the mold member is disposed in the cooling part 31.

A pouring apparatus 51 that pours the molten metal to the mold member by pressure is further provided in the molten-metal push-out part 21. The pouring apparatus 51 is a pouring unit that supplies the mold member with a predetermined amount of the molten metal 53 in a pouring basin 52, by pressure through the use of a piston 54 that is vertically moved in a cylinder 56 by a piston apparatus 55. An appropriate amount of the molten metal 53 is supplied to the pouring basin 52 via a molten metal runner 59 from a molten-metal smelting furnace 58 provided in the inert gas atmosphere outside a partition wall of the joining furnace 1.

Further, a guide 48 being a passage member is provided starting from the first partition wall 13, extending along the plural process regions, namely, the atmosphere replacing/heating part 11, the molten-metal push-out part 21, and the cooling part 31, and passing through the fourth partition wall 33. An end of this guide 48 on a mold inserting side is a mold inlet 43, and an is end thereof on a mold take-out side is a mold outlet 46. Portions each having a length corresponding roughly to one piece of the mold member or two from each of the ends of the guide 48, namely, the mold inlet 43 and the mold outlet 46, are hollow cylindrical portions 49, and the remaining middle portion is constituted of an upper mold guide rail 41 and a lower mold guide rail 42 that have cross sections, for example, in a horseshoe shape, the upper mold guide rail 41 and the lower guide rail 42 facing each other at opening ends thereof.

The guide 48 has, in the atmosphere replacing/heating part 11, an opening portion 44 for atmosphere replacement in mold; in the molten-metal push-out part 21, it has a narrow portion 57 open in the wall thereof that is a pouring spout of the pouring apparatus 51, and an atmosphere vent 47 open in the wall thereof apart from the narrow portion 57 by an appropriate distance; and in the cooling part 31, it has the aforesaid cooling jacket 45 provided on the wall thereof.

In the joining furnace 1 described above, when the mold members having the ceramic members placed therein are successively inserted from the mold inlet 43 provided at the end of the guide 48, first in the atmosphere replacing/heating part 11, each of the mold members advances in the cylindrical portion 49 and the guide 48 while being heated by the atmosphere replacing/heating part heater 12, and when it reaches the opening portion 44 for atmosphere replacement in mold, the atmosphere in the mold member is replaced with the inert gas atmosphere. This inert gas atmosphere is a nitrogen gas, an argon gas, or the like whose oxygen concentration is controlled at a predetermined value or lower, preferably 1% or lower. Incidentally, the dimension of the mold member, which will be detailed later, is such that the mold member is practically in close contact with an inner wall of the cylindrical portion 49, so that the invasion of the atmosphere into the guide 48 is prevented even when the mold members are successively inserted from the mold inlet 43. After passing through the cylindrical portion 49, the mold member advances through the process regions, being tightly held between the upper mold guide rail 41 and the lower mold guide rail 42.

Next, when the mold member advances to the molten-metal push-out part 21 to reach an area under the poring apparatus 51, the molten-metal 53 is poured thereto through the narrow portion 57 while the mold member is being heated by the molten-metal push-out part heater 22 to the temperature appropriate for pouring. At this time, the pouring basin 52, the piston 54, the piston apparatus 55, and the cylinder 56 provided in the pouring apparatus 51 cooperatively operate to pour a predetermined amount of the molten metal 53 to the mold member at a predetermined pressure. The pouring basin 52 in which an amount of the molten metal 53 has been reduced due to this pouring is refilled with the molten metal 53 from the molten metal smelting furnace 58, when necessary. Incidentally, the atmosphere in the mold member escapes through the atmosphere vent 47 when the molten metal 53 is poured to the mold member.

The mold member to which the molten metal 53 has been poured advances to the cooling part 31, and the cooling part heater 32 and the cooling jacket 45 operate in cooperation to lower the temperature of the mold member at a predetermined temperature drop rate, thereby cooling and solidifying the molten metal 53. At this time, since the mold member gets to the cooling jacket 45 provided in the lower mold guide rail 42 while being tightly held between the upper and lower mold guile rails 41, 42, it is possible to shift a cooled and solidified portion of the molten metal 53 in one direction, starting from a lower portion thereof on a mold outlet 46 side of the mold member, subsequently toward a mold inlet 43 side of the mold member, and toward an upper portion of the mold member in accordance with the advance of the mold member, which is preferable. This will be detailed later.

After passing through the cooling jacket 45, the mold member, which has been tightly held between the upper and lower mold guide rails 41, 42, passes through the cylindrical portion 49 again to be taken out from the mold outlet 46. Since an inner wall of this cylindrical portion 49 on the mold outlet 46 side also comes into practically close contact with the mold member, the invasion of the atmosphere into the guide 48 is prevented even when the mold members are taken out from the mold outlet 46 successively.

Next, an example of the mold member according to the present invention will be explained using FIG. 2A and FIG. 2B and, using FIG. 2C and FIG. 2D, the state when the mold member passes through a passage member will be further explained.

Figure 2:
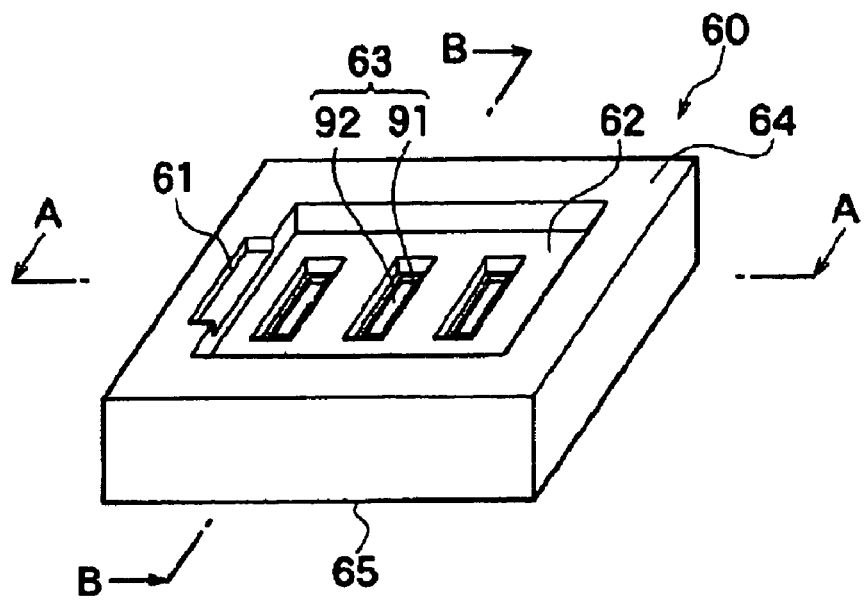
FIG. 2A is a perspective view of a mold member according to the present invention.
FIG. 2B is a cross sectional view of the mold member according to the present invention, taken along the A—A line.
FIG. 2C and FIG. 2D are cross sectional views taken along the B—B line when the mold member passes through the inside of a passage member.
Figure 2:
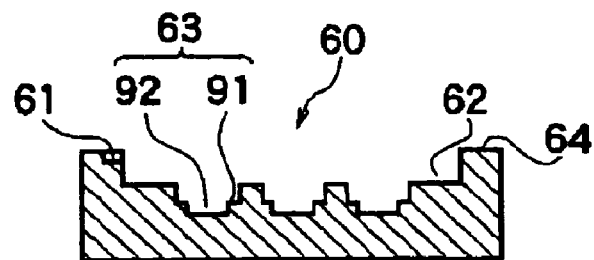
Figure 2:
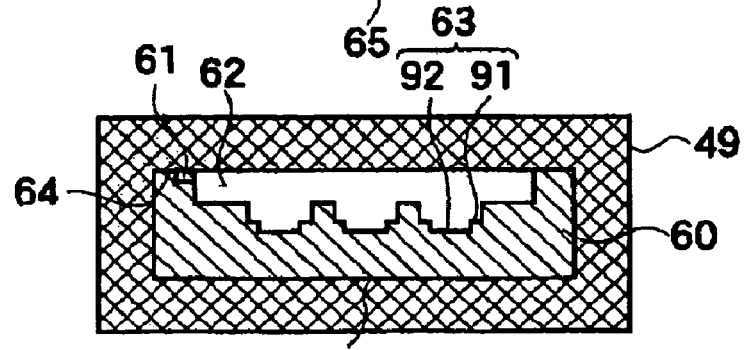
Figure 2:
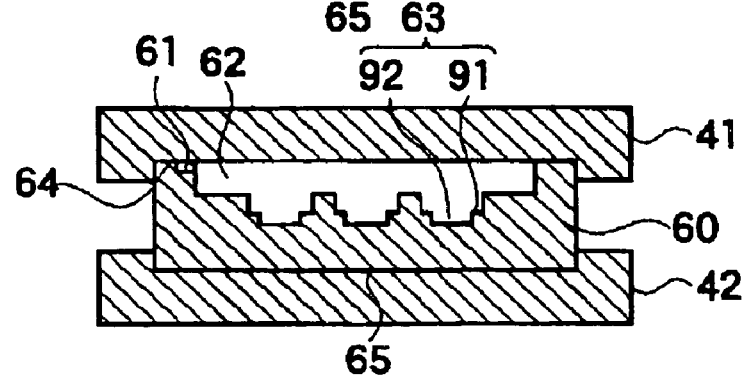
Figure 3:
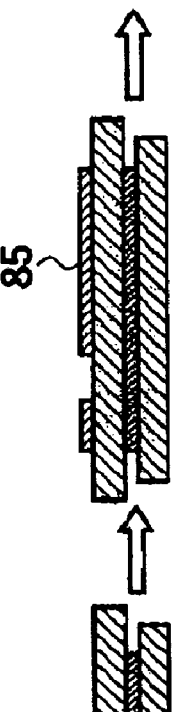
FIG. 3A to FIG. 3E are vertical sectional views showing steps of manufacturing a ceramic member and placing the ceramic member in the mold member.
Figure 3:
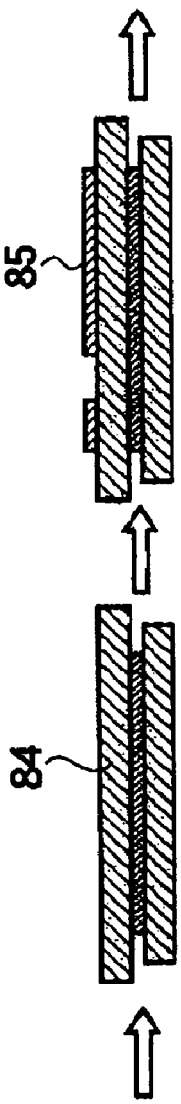
Figure 3:
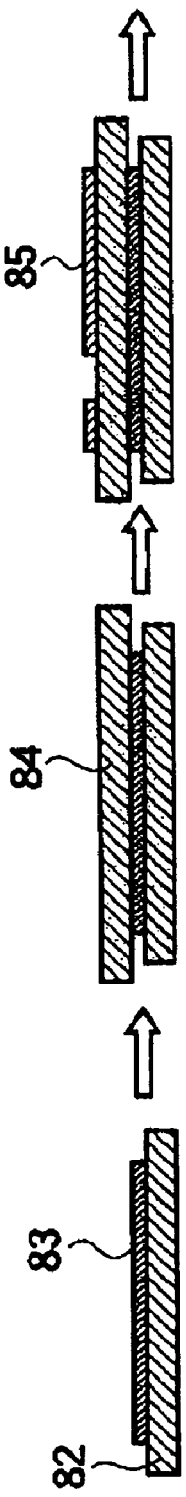
Figure 3:
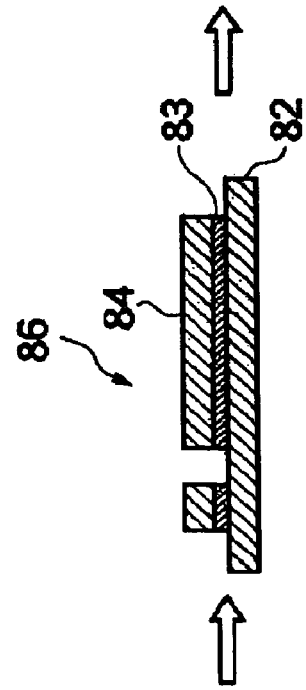
Figure 3:
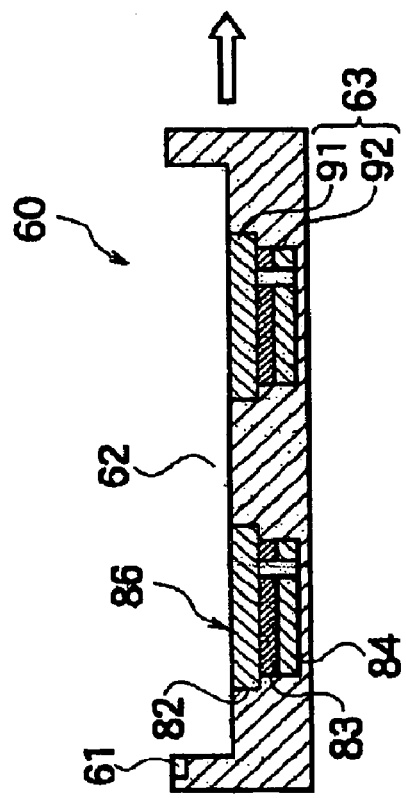

As shown in FIG. 2A and FIG. 2B, an external shape of a mold 60 that is a mold member is a rectangular parallelepiped having a mold upper face 64 and a mold lower face 65. A first mold recessed portion 62 that is to be filled with a molten metal and second mold recessed portions 63 (FIG. 2 shows an example when they are disposed at three places) in which later-described ceramic substrates are to be disposed are cut in the mold upper face 64. Note that, when the later-described ceramic substrates have metal plates joined thereon in advance, each of the second mold recessed portions 63 is preferably cut in two separate steps to produce a portion 91 having a size corresponding to the size of the ceramic substrate to be disposed therein and a portion 92 having a size corresponding to the size of the metal plate to be disposed therein. Further, the mold upper face 64 has a recessed portion that is a shrinkage cavity inducing portion 61 provided adjacent to a portion where the molten metal filled in the first mold recessed portion 62 is finally solidified when this mold 60 is cooled in the cooling part 31.

FIG. 2C is a cross sectional view when the mold 60 passes through the inside of the cylindrical portions 49 provided on both ends of the guide 48 that is a passage member disposed in the joining furnace 1 according to the present invention, and FIG. 2D is a cross sectional view when the mold 60 passes between the upper and lower mold guide rails 41, 42 provided in the middle portion of the guide 48 that is the passage member.

First, as shown in FIG. 2C, the external shape of the mold 60 and the inner walls of the cylindrical portions 49 are made to have such dimensions that the mold 60 practically comes into close contact with the inner walls of the cylinder portions 49 when the mold 60 passes through the inside of the cylindrical portions 49. Thus, the external shape of the mold 60 and the inner walls of the cylindrical portions 49 are made to have such dimensions as to fit each other, and the cylindrical portions 49 are made to have a length each corresponding roughly to one piece of the mold 60 or two pieces, so that it can be practically prevented that the atmosphere passes through a gap between the mold 60 and the cylindrical portions 49 to invade into the guide 48.

Next, as shown in FIG. 2D, the mold 60 having passed through the cylindrical portion 49 is tightly held between the upper mold guide rail 41 and the lower mold guide rail 42 that are disposed in the middle portion of the guide 48. The mold 60 passes through the guide 48, being tightly held between the upper and lower guide rails 41, 42. The middle portion of this guide 48 is preferably so structured that it is divided into the upper and lower guide rails 41, 42 because, in the middle portion, it is not necessary to prevent the invasion of the atmosphere and because this structure is easily applicable by widening or narrowing the interval between the upper and lower mold guide rails 41, 42 when molds different in height are used as the molds 60. In this embodiment, the guide 48 is shown as an example in which the upper and lower mold guide rails 41, 42 each having a cross section in a horseshoe shape face each other at opening ends thereof as described above, but other structures may be adopted as long as they can tightly hold the mold member therebetween to restrict the advancement direction thereof.

The cylindrical portions 49 on both sides of the guide 48 have a cylindrical structure as described above, and therefore, when a mold different in external height is to be inserted therein, the cylindrical portions 49 can be pulled out to be replaced with other cylindrical portions 49 having a different dimension corresponding to the height of the newly inserted mold. As described above, since the length of this cylindrical portion 49 is a length roughly corresponding to one piece of the mold member or two pieces, the replacement thereof is easy.

Thus, with such a structure of the guide 48 that the end portions thereof are the cylindrical portions 49 and the middle portion thereof is constituted of the upper and lower mold guide rails 41, 42, the successive insertion of the plural molds 60 contiguous to one another into the guide 48 can practically prevent the invasion of the atmosphere into the guide 48 even if the mold inlet 43 and the mold outlet 46 explained in FIG. 1 are open to the atmosphere, and moreover, this structure is easily adaptable to the use of molds different in external height as the molds 60. Note that it is preferable to use carbon materials or metal as materials of the upper and lower mold guide rails 41, 42 and the cylindrical portions 49.

Next, the step of manufacturing the ceramic member used as an example of the present invention and how the manufactured ceramic member is placed in the mold member will be explained using FIG. 3A to FIG. 3E.

First, as shown in FIG. 3A, a brazing material 83 containing active metal such as Ti and Zr is printed on a ceramic substrate 82. The printing thickness, though it may be determined appropriately depending on the materials of the ceramic member, a metal member, and the brazing material, is preferably about 20 μm when, for example, aluminum nitride is used as the ceramic member and Cu is used as a circuit metal plate which will be described later.

Then, as shown in FIG. 3B, a circuit metal plate 84 is put on the brazing material 83, and they are heated to about 850° C. in a vacuum atmosphere, so that the circuit metal plate 84 is joined onto the ceramic substrate 82. As the circuit metal plate 84, copper, aluminum, or the like is preferably used.

Further, as shown in FIG. 3C, an etching resist 85 is printed in a predetermined pattern on this circuit metal plate 84 joined onto the ceramic substrate 82, and thereafter, etching is applied to remove the circuit metal plate 84 and the brazing material 83 outside the pattern.

Thus, obtained is a ceramic member 86, which is shown in FIG. 3D, having on the ceramic substrate 82 the circuit metal plate 84 and the brazing material 83 that have been etched into the pattern.

Here, as shown in FIG. 3E, the obtained ceramic members 86 are placed horizontally in the second mold recessed portions 63 that are mounting-portions in the mold 60. At this time, the ceramic substrate 82, and the patterned circuit metal plate 84 and brazing material 83 of the ceramic member 86 are received stably owing to the self-weight in the portion 91 that has the size corresponding to the size of the placed ceramic substrate and the portion 92 that has the size corresponding to the size of the placed metal plate in each of the second mold recessed portions 63, so that an upper face of the ceramic substrate 82 becomes flush with a face of the first mold recessed portion 62.

Alternatively, a method of directly joining the circuit metal plate 84 onto the ceramic substrate 82 may be adopted, instead of using the brazing material 83 as a method of joining the circuit metal plate 84 onto the ceramic substrate 82. In this case, the circuit metal plate 84 is directly placed on the ceramic substrate 82 and they are heated, for example, in a nitride atmosphere, so that the circuit metal plate 84 can be directly joined onto the ceramic substrate 82.

Next, using FIG. 4A to FIG. 4C, explanation will be given on the step of joining a metal onto the ceramic members 86 placed in the mold 60 to manufacture a metal-ceramic composite member by the joining furnace 1 according to the present invention and on the manufactured metal-ceramic composite member.

First, as shown in FIG. 4A, the plural molds 60 each having the ceramic members 86 placed therein are inserted into the guide 48 from the mold inlet 43 provided at the first partition wall 13 of the joining furnace 1 so as to be contiguous to one another. Then, the ceramic members 86 and the molds 60 advance in the atmosphere replacing/heating part 11 while being heated by the atmosphere replacing/heating part heater 12, and when the first mold recessed portion 62 reaches the opening portion 44 for atmosphere replacement in mold, the atmosphere in the mold recessed portion is replaced with the inert atmosphere of the atmosphere replacing/heating part 11. At this time, the temperature of the inert atmosphere of the atmosphere replacing/heating part 11 is preferably about 500° C. to about 750° C.

The ceramic members 86 and mold 60 for which the atmosphere replacement and heating have been completed enter the molten-metal push-out part 21 to advance therein while being heated this time to about 650° C. to about 850° C. by the molten-metal push-out part heater 22, and reaches the pouring apparatus 51.

When the mold 60 having the ceramic members 86 placed therein reaches the pouring apparatus 51, the piston 54 is pushed down by the piston apparatus 55 as shown in FIG. 4B, so that the molten metal 53 in the pouring basin 52 is poured by pressure into the first mold recessed portion 62 from the cylinder 56 through the narrow portion 57. The pouring rate of the molten metal 53 at this time is preferably 5 g/sec to 100 g/sec, and the piston 54 is preferably pressed with a load of several hundreds g to several kg. The narrow portion 57 is preferably 0.2 mm to 1 mm in diameter and 5 mm to 30 mm in length.

At this time, since the mold 60 is moving while being tightly held by the guide 48 along the periphery thereof and sandwiched by the preceding and subsequent ones as described above, so that the first mold recessed portion 62 can be accurately aligned with the narrow portion 57.

Since the atmosphere in the molten-metal push-out part 21 is inactive, the molten metal 53 does not easily oxidize, but even if an oxide coating is produced, the oxide coating is broken when the molten metal 53 passes through the narrow portion 57, so that the fresh molten metal 53 containing almost no metal oxide is poured by pressure into the first mold recessed portion 62. Here, since the mold upper face 64 and the upper mold guide rail 41 are in close contact with each other as described above, the atmosphere in the first mold recessed portion 62 escapes from the aforesaid atmosphere vent 47 while the molten metal 53 is being filled therein, Here, when the mold 60 has the shrinkage cavity inducing portion 61 explained in FIG. 2A, it is preferable that the molten metal 53 containing almost no oxide metal on the surface thereof that has passed through the narrow portion 57 is poured onto the shrinkage cavity inducing portion 61, instead of being poured onto the ceramic members 86 directly as described above, and reaches the surfaces of the ceramic members 86 after flowing along the surface of the mold 60. This is because the surface of the molten metal 53 reaching the surfaces of the ceramic members 86 can be made fresher when the metal oxide that has not been removed from and remains on the surface of the molten metal 53 even after it passes through the narrow portion 57 is adsorbed by the mold member or taken into an inner part of the molten metal 53. The fresher surface of the molten metal 53 reaching the surfaces of the ceramic members 86 makes it possible to further avoid the decrease in the metal-ceramic joining strength since the metal oxide does not exist on the metal-ceramic interface.

Meanwhile, even when the molten metal 53 is poured by pressure into the first mold recessed portion 62, the ceramic members 86 stably placed horizontally in the second mold recessed portions 63 owing to their own weight do not fluctuate in its position and posture. Thus, the molten metal 53 poured by pressure is filled in the first mold recessed portion 62 and the shrinkage cavity inducing portion 61.

Here, in FIG. 4A again, the mold 60 filled with the molten metal 53 enters the cooling part 31, advances therein while being temperature-controlled this time at about 200° C. to 700° C. by the cooling part heater 32, and reaches the cooling jacket 45. Here, the cooling jacket 45 is provided to be flush with the surface of the lower mold guide rail 42 and has been water-cooled to about 30° C., so that the cooling and solidification of the molten metal 53 filled in the mold 60 are started from a lower portion thereof on the mold outlet 46 side, progress toward an upper portion thereof, and in accordance with the advance of the mold 60, toward the mold outlet 43 side in one direction. As a result, the joining metal that is the cooled and solidified molten metal 53 has a uniform crystal structure to become excellent in uniform electrical characteristics and etching characteristics and at the same time, the metal-ceramic joining strength in the ceramic member 86 also becomes uniform and firm.

More preferably, when the shrinkage cavity inducing portion 61 explained in FIG. 2A is provided at an end point of the cooling and solidification that progress in one direction, the shrinkage cavity caused by the volume reduction of the filled molten metal at its solidification can be easily and reliably induced to and generated in the shrinkage cavity inducing portion 61. As a result, the generation of the shrinkage cavity in the metal-ceramic composite member being a product can be avoided.

As the cooling and solidification progress, a camber occurs in a solidified portion of the molten metal 53 due to the difference in thermal expansion coefficient between the molten metal 53 and the ceramic members 86, but the resisting force of the inner walls of the upper and lower mold guide rails 41, 42 and the mold 60 corrects the deformation, so that the molten metal 53 is solidified maintaining its shape as it is filled in the first mold recessed portion 62.

When the mold 60 in which the filled molten metal 53 is solidified is taken out from the mold outlet 46 provided at the fourth partition wall 33, desired metal-ceramic composite members have been obtained. The production speed of roughly one mold to five molds/minute, though varying depending on the size and shape of the metal-ceramic composite members, has been achieved.

FIG. 4C is a perspective view of an example of the metal-ceramic composite member manufactured through the above-described step. This metal-ceramic composite member is the one that is so structured that the ceramic substrates 82 of a plurality of members are joined onto a joining metal 87 being a metal member, each of the plural members being so structured that the circuit metal plate 84 is joined onto the ceramic substrate 82 via the brazing material 83 or the circuit metal plate 84 is directly joined onto the ceramic substrate 82.

Here, an oxide, a nitride, or a carbide of aluminum, or an oxide, a nitride, or a carbide of silicon, all excellent in electrical insulation and thermal conductivity, is preferably usable as the ceramic substrate 82. As the joining metal 87, preferably usable is aluminum or an alloy essentially consisting of aluminum having a sufficient joining strength on the metal-ceramic interface and being excellent in electrical conductivity and thermal conductivity. The adoption of this structure is preferable since this structure makes it possible to obtain a widely applicable metal-ceramic composite member.

The embodiment of the present invention explained in detail above allows the manufacture of metal-ceramic composite members in various shapes. Examples of embodiments relating to the manufacture of metal-ceramic composite members, among all, having typical shapes will be further explained.

(Metal-Ceramic Composite Member with Cooling Fin)

A metal-ceramic composite member with cooling fin will be explained using FIG. 5, FIG. 6A, and FIG. 6B.

Figure 5:
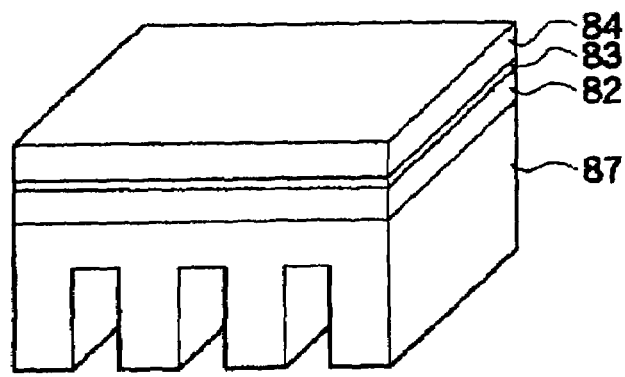
FIG. 5 is a perspective view of an example of a metal-ceramic composite member with cooling fin.
Figure 6:
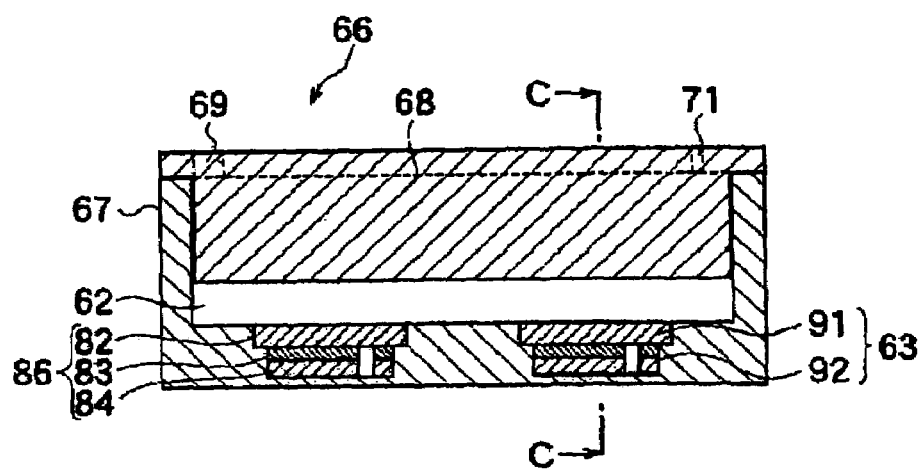
FIG. 6A is a cross sectional view of a mold for the metal-ceramic composite member with cooling fin.
FIG. 6B is a cross sectional view taken along the C—C line in FIG. 6A.
Figure 6:
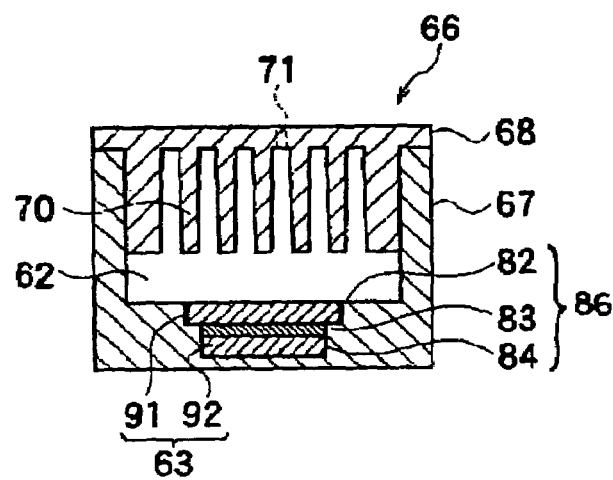

Here, FIG. 5 is a perspective view of an example of the metal-ceramic composite member with cooling fan, FIG. 6A is a cross sectional view of a mold 66 for the metal-ceramic composite member with cooling fan (hereinafter, referred to as a fin mold), and FIG. 6B is a cross sectional view taken along the C—C line in FIG. 6A First, in FIG. 5, the metal-ceramic composite member with cooling fin, similarly to the above-described metal-ceramic composite member, is so structured that a circuit metal plate 84 is joined onto one face of a ceramic substrate 82 via a brazing material 83 and a joining metal 87 having a comb-shaped cooling fin is joined onto the other face thereof.

Next, using FIG. 6A and FIG. 6B, explanation will be given on a mold for the metal-ceramic composite member with cooling fin for use in manufacturing the example of the metal-ceramic composite member with cooling fin.

In FIG. 6A and FIG. 6B, the fin mold 66 has a lower mold 67 and a lid mold 68. In the lower mold 67, a first mold recessed portion 62 and second mold recessed portions 63 are provided, and in each of the second mold recessed portions 63, a portion 91 that is made to have the size corresponding to the size of a ceramic substrate to be placed therein and a portion 92 that is made to have the size corresponding to the size of a metal plate to be placed therein are cut, and the metal-ceramic composite member having the aforesaid ceramic substrate 82, brazing material 83, and circuit metal plate 84 is-placed therein. The lid mold 68 having a comb portion 70, which is a comb-shaped irregularity, provided on a surface thereof facing this metal-ceramic composite member is put on the lower mold 67 so as to cover the lower mold 67, leaving a space in the first mold recessed portion 62. Further, an opening portion 69 and a lid atmosphere vent 71 are provided at appropriate places of the lid mold 68. Note that the opening portion 69 serves also as a shrinkage cavity inducing portion in the fin mold 66.

When a molten metal is poured from the joining furnace 1 explained in FIG. 1 to the fin mold 66 in which the metal-ceramic composite members are placed, the metal-ceramic composite member with cooling fin shown in FIG. 5 can be manufactured. The manufacture thereof will be explained using again FIG. 4A and FIG. 4B.

Since the fin mold 66 in which the metal-ceramic composite members are placed has a larger height than that of the mold 60 explained in FIG. 4A to FIG. 4C, the interval between the upper and lower mold guide rails 41, 42 is enlarged and the cylindrical portions 49 on both sides of the guide 48 are pulled out for replacement with those that closely fit the fin mold 66. Thereafter, the plural fin molds 66 are inserted from the mold inlet 43, being contiguous to the preceding and subsequent ones. Each of the fin molds 66 advances in the atmosphere replacing/heating part 11, and while the fin molds 66 are being heated, the lid opening portion 69 or the lid atmosphere vent 71 reaches the opening portion 44 for atmosphere replacement in mold, at which the atmosphere inside the fin mold 66 is replaced with an atmosphere whose oxygen concentration is controlled at a predetermined value or lower.

Next, when the opening portion 69 of the fin mold 66 reaches the position of the narrow portion 57, the molten metal 53 is poured through the opening portion 69. Since the periphery of the fin mold 66 is tightly held between the upper and lower mold guide rails 41, 42 and it is also sandwiched by the preceding and subsequent ones, the positions of the opening portion 69 and the narrow portion 57 can be easily and accurately aligned. As a result, though the structure of the opening portion 69 is simple, the molten metal 53 is prevented from leaking to an undesired place even when the molten metal 53 is poured by pressure through the narrow portion 57. Further, since the molten metal 53 is given a pressure, it also fills the comb-shaped portion 70 and the opening portion 69 serving also as the shrinkage cavity inducing portion, leaving no space left unfilled. Further, since the ceramic member 86 is placed horizontally in the second mold recessed portion 63 to be stable owing to its own weight, it does not fluctuate in its position and posture-even when a large amount of the molten metal 53 is poured by pressure.

As the molten metal 53 is filled in the first mold recessed portion 62, the atmosphere in the first mold recessed portion 62 escapes from the lid atmosphere vent 71 that has reached the position aligned with the position of the atmosphere vent 47.

When the filling of the molten metal 53 in the first mold recessed portion 62 is thus finished, the fin mold 66 advances to the cooling part 31, where the solidification of the filled molten metal 53 is started from the mold outlet 46 side thereof by the cooling jacket 45. At this time, a strong force is given to the lower mold 67 and the lid mold 68 due to the camber of the molten metal 53 that has started solidifying, but since they are tightly held between the upper and lower mold guide rails 41, 42, the mold does not have to resist this camber only with its own strength, nor is it necessary to provide a tool for fixing the lower mold 67 and the lid mold 68. Further, the shrinkage cavity generated in accordance with the solidification of the molten metal 53 is induced to and generated in the shrinkage cavity inducing portion, 69, so that the generation of the shrinkage cavity in the metal-ceramic composite member with cooling fin can be avoided.

In the above-described manner, it is possible to successively manufacture the metal-ceramic composite members with cooling fin. At this time, since both of the lower mold 67 and the lid mold 68 can be small-sized and light-weighted, the fin mold 66 can be simple in its external shape and internal structure, which facilitates the beating and cooling thereof. Consequently, it is made possible to improve productivity and to reduce mold manufacturing cost as well.

(Metal-Ceramic Composite Member with Wiring Joining Metal)

A metal-ceramic composite member with wiring joining metal will be explained using FIG. 7 and FIG. 8.

Figure 7:
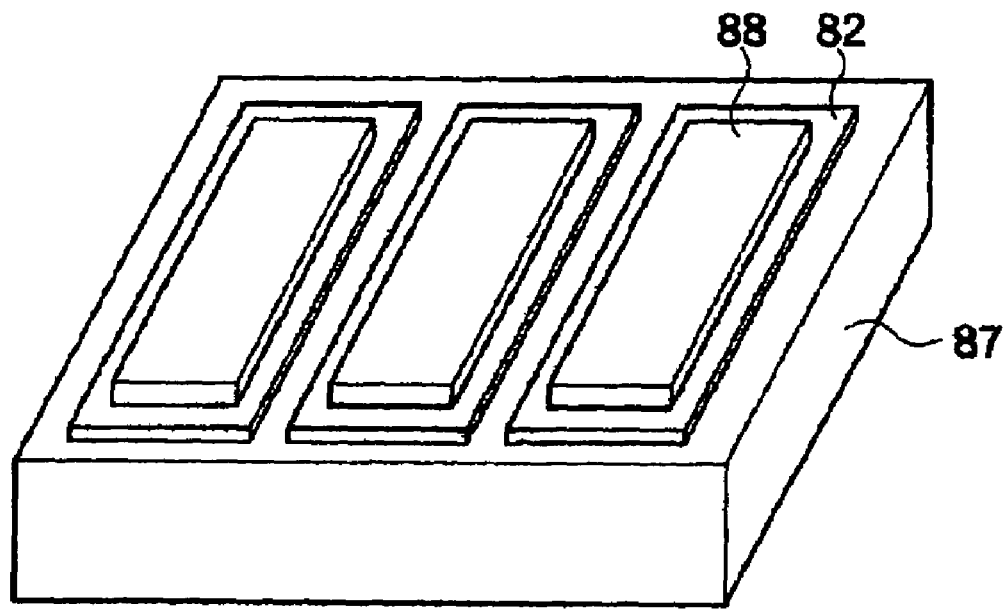
FIG. 7 is a perspective view of an example of a metal-ceramic composite member with wiring joining metal.
Figure 8:
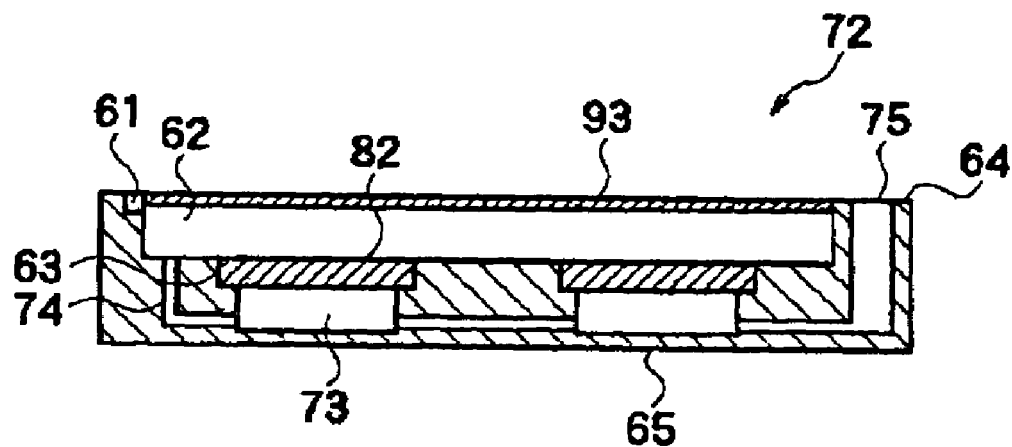
FIG. 8 is a cross sectional view of a mold for the metal-ceramic composite member with wiring joining metal.

Here, FIG. 7 is a perspective view of an example of the metal-ceramic composite member with wiring joining metal, and FIG. 8 is a cross sectional view of a mold 72 for the metal-ceramic composite member with wiring joining metal (hereinafter, referred to as a wiring mold).

First, in FIG. 7, the metal-ceramic composite member with wiring joining metal is a member having such a structure that, in the metal-ceramic composite member explained using FIG. 3A to FIG. 3E, a wiring joining metal is joined instead of the brazing material and the copper plate. In other words, it has such a structure that one or a plurality of ceramic substrate(s) 82 is(are) joined onto a joining metal 87 to be a base and a wiring joining metal 88 is further joined onto each of the ceramic substrates 82.

Next, using FIG. 8, explanation will be given on a mold for the metal-ceramic composite member with wiring joining metal for use in manufacturing the example of the metal-ceramic composite member with wiring joining metal.

In FIG. 8, the wiring mold 72 is in a rectangular parallelepiped shape having a mold upper face 64 and a mold lower face 65, similarly to the mold explained in FIG. 2A. A first mold recessed portion 62 to be filled with a molten metal and second mold recessed portions 63 in which ceramic substrates are to be placed are provided on the mold upper face 64, third mold recessed portions 73 to be filled with the molten metal are further provided in lower portions of the second mold recessed portions 63, and an in-mold molten metal runner 74 extends from the mold inlet side of the first mold recessed portion 62 toward the third mold recessed portions 73. This in-mold molten metal runner 74 connects the third mold recessed portions 73, and thereafter, communicates with an in-mold atmosphere vent 75 provided on the mold upper face 64 on the mold outlet side.

Note that the mold upper face 64 has a recessed portion, which is a shrinkage cavity inducing portion 61, provided at a portion adjacent to a portion where the molten metal filled in the first mold recessed portion 62 is finally solidified when this wiring mold 72 is cooled in the cooling part 31. The in-mold atmosphere vent 75 also works as a shrinkage cavity inducing portion for the second mold recessed portions 63. Further, in this wiring mold 72, a lid mold 93 for the wiring mold 72 is provided so as to cover an upper face of the first mold recessed portion 62 except the shrinkage cavity inducing portion 61.

When the molten metal is poured from the joining furnace 1 explained in FIG. 1 by pressure into this wiring mold 72 in which the ceramic substrates are placed, the metal-ceramic composite member with wiring joining metal shown in FIG. 7 can be manufactured. The manufacture thereof will be explained using again FIG. 4A and FIG. 4B.

First, the interval between the upper and lower mold guide rails 41, 42 is adjusted so as to correspond to the height of the wiring mold 72 and at the same time, the cylindrical portions 49 at both ends of the guide 48 are pulled out to be replaced with those closely fitting the wiring mold 72. Thereafter, the plural wiring molds 72 are inserted from the mold inlet 43, being contiguous to the preceding and subsequent ones. Each of the wiring molds 72 advances in the atmosphere replacing/heating part 11, and while the wiring mold 72 is being heated, the first mold recessed portion 62 or the in-mold atmosphere vent 75 reaches the opening portion 44 for atmosphere replacement in mold, at which the atmosphere in the first and third mold recessed portions 62, 73 in the wiring mold 72 is replaced with an atmosphere whose oxygen concentration is controlled at a predetermined value or lower.

Subsequently, when the shrinkage cavity inducing portion 61 in the first mold recessed portion 62 of the wiring mold 72 reaches the position of the narrow portion 57, and the positions of the atmosphere vent 47 and the in-mold atmosphere vent 75 are aligned with each other, the molten metal 53 is poured through the shrinkage cavity inducing portion 61 adjacent to the first mold recessed portion 62. As the first mold recessed portion 62 is filled with the molten metal 53, the atmosphere inside the first mold recessed portion 62 escapes from the atmosphere vent 47. The molten metal 53 has viscosity, and therefore, when a considerable amount of the molten metal 53 is filled in the first mold recessed portion 62, the filling of the third mold recessed portions 73 with the molten metal 53 is in turn started via the in-mold molten metal runner 74.

Here, if the molten metal 53 starts to fill the third mold recessed portions 73 before the first mold recessed portion 62 is sufficiently filled with the molten metal 53, the ceramic substrates 82 may possibly float up by the pressure of the molten metal 53 in the third mold recessed portions 73. Therefore, it is preferable to appropriately adjust the diameter of the in-mold molten metal runner 74, thereby causing the molten metal 53 to start filling the third mold recessed portions 73 after a sufficient amount of the molten metal 53 is filled in the first mold recessed portion 62. As the third mold recessed portions 73 are filled with the molten metal 53, an atmosphere in the third mold recessed portions 73 escapes from the in-mold atmosphere vent 75. Since the molten metal 53 is pressure-inserted, it fills the area from the first and third mold recessed portions 62, 73 to the in-mold atmosphere vent 75, leaving no space unfilled.

When the first and third mold recessed portions 62, 73 are thus completely filled with the molten metal 53, the wiring mold 72 advances to the cooling part 31, where the solidification of the filled molten metal 53 is started by the cooling jacket 45 from the mold outlet 46 side. At this time, a strong force is given to the mold lower face 65 due to the camber of the molten metal 53 that has started solidifying in the third mold recessed portions 73, but since the wiring mold 72 is tightly held between the upper and lower mold guide rails 41, 42, the mold lower face 65 and the lower mold guide rail 42 work in cooperation to generate a resisting force. Similarly, the lid mold 93 of the wiring mold 72 and the upper mold guide rail 41 work in cooperation to generate a resisting force against a force that is given to the lid mold 93 of the wiring mold 72 due to the camber of the molten metal 53 which has started solidifying in the first mold recessed portion 62. Further, the shrinkage cavity generated in accordance with the solidification of the molten metal 53 is induced to and generated in the shrinkage cavity inducing portion 61 and the in-mold atmosphere vent 75, so that the generation of the shrinkage cavity in the metal-ceramic composite member with wiring joining metal can be avoided. Note that, since the upper face of the first mold recessed portion 62 is covered with the lid mold 93 of the wiring mold 72 at this time, moldablity in this portion can be enhanced.

In the above-described manner, it is possible to successively manufacture the metal-ceramic composite members with wiring joining metal. At this time, since the mold lower face 65 and the lid mold 93 of the wiring mold 72 do not require strength, they can be small-sized and light-weighted, so that the wiring mold 72 can be simple both in its external shape and internal structure, which facilitates the heating and cooling thereof. Consequently, it is made possible to improve productivity and to reduce mold manufacturing cost as well.

(Metal-Ceramic Composite Member with Cooling Fin and Wiring Joining Metal)

A metal-ceramic composite member with cooling fin and wiring joining metal will be explained using FIG. 9, FIG. 10A, and FIG. 10B.

Figure 9:
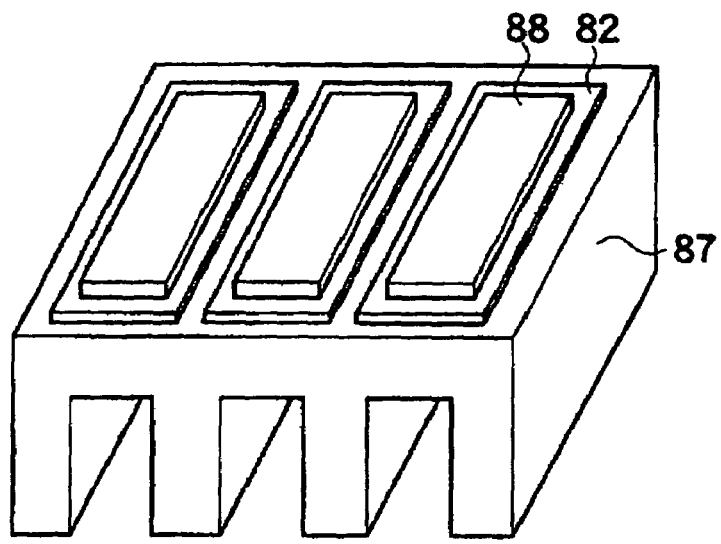
FIG. 9 is a perspective view of an example of a metal-ceramic composite member with cooling fin and wiring joining metal.
Figure 10:
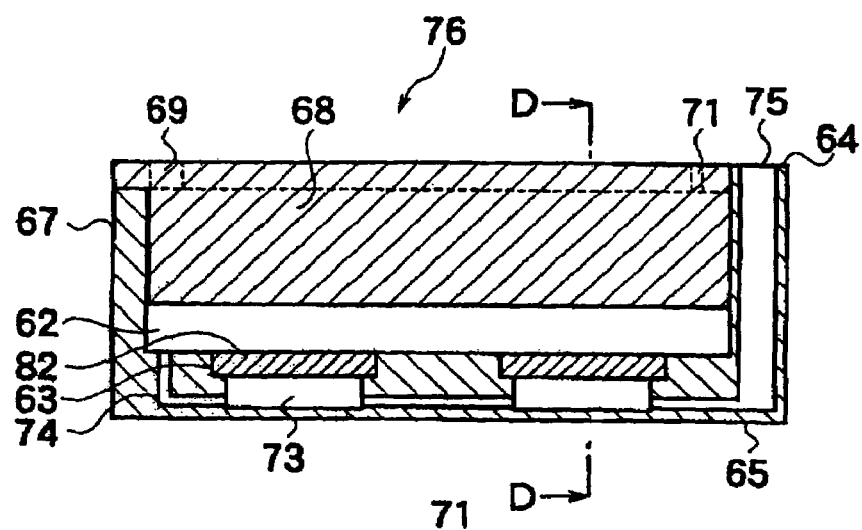
FIG. 10A is a cross sectional view of a mold for the metal-ceramic composite member with cooling fin and wiring joining metal.
FIG. 10B is a cross sectional view taken along the D—D line in FIG. 10A.
Figure 10:
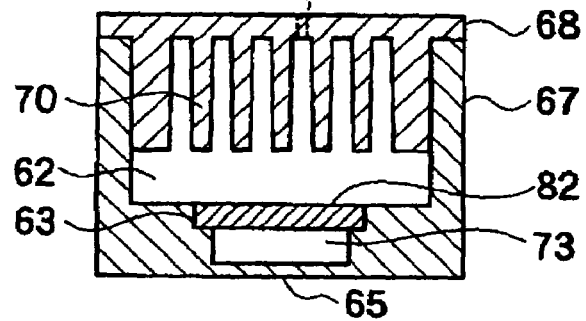

Here, FIG. 9 is a perspective view of an example of the metal-ceramic composite member with cooling fin and wiring joining metal, FIG. 10A is a cross sectional view of a mold 76 for the metal-ceramic composite member with cooling fin and wiring joining metal (hereinafter, referred to as a fin/wiring mold), and FIG. 10B is a cross sectional view taken along the D—D line in FIG. 10A.

First, in FIG. 9, the metal-ceramic composite member with cooling fin and wiring joining metal is so structured that the metal-ceramic composite member with cooling fin explained using FIG. 5 and the metal-ceramic composite member with wiring joining metal explained using FIG. 7 are integrated. Specifically, one or a plurality of the ceramic substrate(s) 82 is(are) joined onto a joining metal 87, which is to be a base, having a comb-shaped cooling fin, and a wiring joining metal 88 is further joined onto each of the ceramic substrates 82.

Next, using FIG. 10A and FIG. 10B, explanation will be given on a mold for the metal-ceramic composite member with cooling fin and wiring joining metal for use in manufacturing the example of the metal-ceramic composite member with cooling fin and wiring joining metal.

In FIG. 10A and FIG. 10B, the fin/wiring mold 76 has a lower mold 67 and a lid mold 68. The lower mold 67 has a first mold recessed portion 62 and second mold recessed portions 63, and the aforesaid ceramic substrates 82 are placed in the second mold recessed portions 63. Further, third mold recessed portions 73 in which a molten metal is to be filled are provided in lower portions of the second mold recessed portions 63, and an in-mold molten metal runner 74 extends from the mold inlet side of the first mold recessed portion 62 toward the third mold recessed portions 73. This in-mold molten metal runner 74 connects the third mold recessed portions 73, and thereafter, communicates with an in-mold atmosphere vent 75 provided on the mold upper face 64 on the mold outlet side.

Meanwhile, the lid mold 68 having a comb-shaped portion 70, which is a comb-shaped irregularity, provided on a face thereof facing the ceramic substrates is disposed so as to cover the lower mold 67, leaving a space in the first mold recessed portion 62 of the lower mold 67. An opening portion 69 and a lid atmosphere vent 71 are provided at appropriate places of the lid mold 68. Note that the opening portion 69 and the lid atmosphere vent 71 also serve as shrinkage cavity inducing portions.

When a molten metal is poured from the joining furnace 1 explained in FIG. 1 to this fin/wiring mold 76 in which the ceramic substrates are placed, it is possible to manufacture the metal-ceramic composite member with cooling fin and wiring joining metal shown in FIG. 9. It is manufactured by concurrently implementing the above-described manufacturing method of the metal-ceramic composite member with cooling fin and manufacturing method of the metal-ceramic composite member with wiring joining metal.

As a result, the metal-ceramic composite members with cooling fin and wiring joining metal can be successively manufactured. At this time, since the lower mold 67 and the lid mold 68 can be both small-sized and light-weighted, the fin/wiring mold 76 can be simple both in its external shape and internal structure, which facilitates the cooling and heating thereof. Consequently, it is made possible to improve productivity and to reduce mold manufacturing cost as well.

(Metal-Ceramic Composite Member with Double-Sided Wiring Joining Metals)

A metal-ceramic composite member with double-sided wiring joining metals will be explained using FIG. 11 and FIG. 12.

Figure 11:
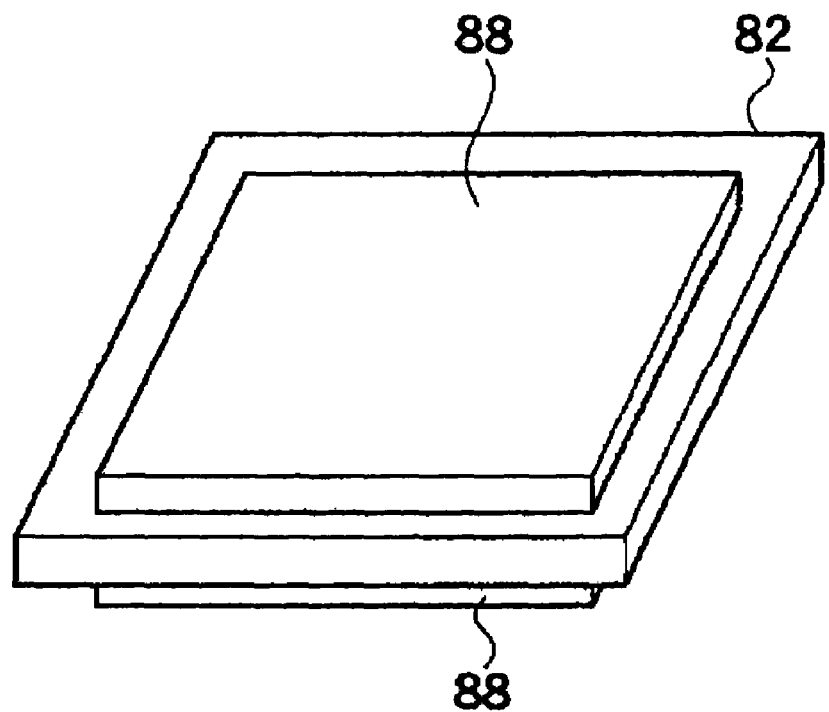
FIG. 11 is a perspective view of an example of a metal-ceramic composite member with double-sided wiring joining metal.
Figure 12:
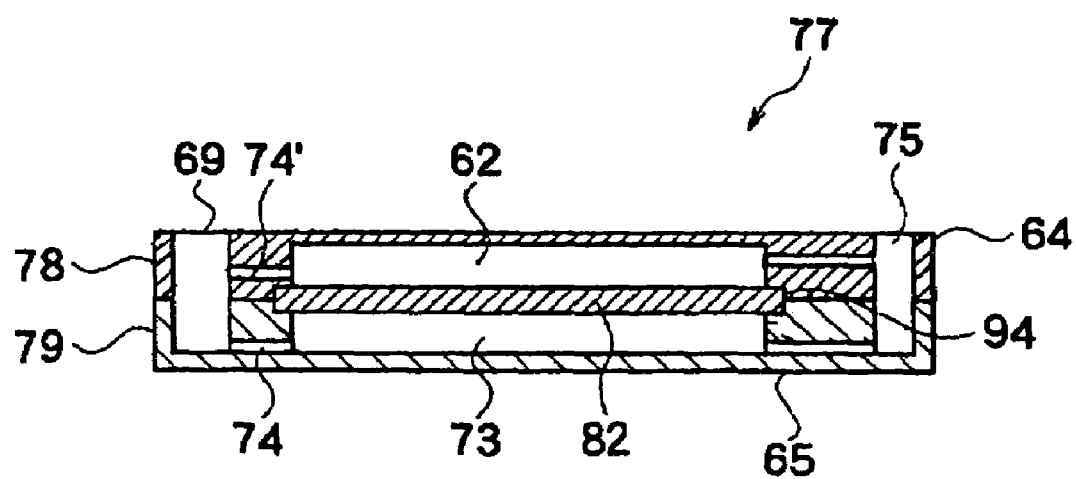
FIG. 12 is a cross sectional view of a mold for the metal-ceramic composite member with the double-sided wiring joining metal.

Here, FIG. 11 is a perspective view of an example of the metal-ceramic composite member with double-sided wiring joining metals, and FIG. 12 is a cross sectional view of a mold 77 for the metal-ceramic composite member with double-sided wiring joining metals (hereinafter, referred to as a double-sided wiring mold).

First, in FIG. 11, the metal-ceramic composite member with double-sided wiring joining metals is a member so structured that wiring joining metals 88 are provided on both faces of the ceramic substrate 82.

Next, using FIG. 12, explanation will be given on a mold for the metal-ceramic composite member with double-sided wiring joining metals for use in manufacturing the example of this metal-ceramic composite member with double-sided wiring joining metals.

As shown in FIG. 12, the double-sided wiring mold 77 has an upper mold 78 and a lower mold 79. Inside the upper and lower molds 78, 79, the ceramic substrate 82 is tightly held by a substrate holding portion 94 provided on a joint face between both of the molds. The ceramic substrate 82 divides the inside of the upper and lower molds 78, 79 into a first mold recessed portion 62 provided in the upper mold 78 and a third mold recessed portion 73 provided in the lower mold 79.

An opening portion 69 is formed on the mold upper face 64 in the upper mold 78 on the mold inlet side by perforating the upper and lower molds 78, 79, and two parallel in-mold molten metal runners 74', 74 further extend from the opening portion 69 toward the first and third mold recessed portions 62, 73. Here, the in-mold molten metal runner 74' is provided in the upper mold 78 and the in-mold molten metal runner 74 is provided in the lower mold 79.

This in-mold molten metal runner 74' communicates with the first mold recessed portion 62 and further communicates with an in-mold atmosphere vent 75 that is formed on the mold upper face 64 on the mold outlet side by perforating the upper and lower molds 78, 79. Whereas, the in-mold molten metal runner 74 communicates with the third mold recessed portion 73 and further communicates with the in-mold atmosphere vent 75.

When a molten metal is poured from the joining furnace 1 explained in FIG. 1 to this double-sided wiring mold 72 in which the ceramic substrate is placed, the metal-ceramic composite member with double-sided wiring joining metals can be manufactured. The manufacture thereof will be explained using again FIG. 4A and FIG. 4B.

First, the interval between the upper and lower mold guide rails 41, 42 is adjusted so as to fit the double-sided wiring mold 77 in terms of height, and the cylindrical portions 49 at both ends of the guide 48 are pulled out to be replaced with those closely fitting the double-sided wiring mold 77. Thereafter, the plural double-sided wiring molds 77 are inserted from the mold inlet 43, being contiguous to the preceding and subsequent ones. Each of the double-sided wiring molds 77 advances in the atmosphere replacing/heating part 11, and while the double-sided wiring mold 77 is being heated, an entrance of the two parallel in-mold molten metal runners 74', 74 or the in-mold atmosphere vent 75 provided on the mold upper face 64 reaches the opening portion 44 for atmosphere replacement in mold, at which the atmosphere in the first and third mold recessed portions 62, 73 in the double-sided wiring mold 77 is replaced with an atmosphere whose oxygen concentration is controlled at a predetermined value or lower.

Next, when the opening portion 69 provided in the mold upper face 64 of the double-sided wiring mold 77 reaches the position of the narrow portion 57 and the positions of the atmosphere vent 47 and the in-mold atmosphere vent 75- are aligned with each other, the molten metal 53 is poured by pressure through the opening portion 69. As the first and third mold recessed portions 62, 73 are filled with the molten metal 53, the atmosphere in the first and third mold recessed portions 62, 73 passes through the in-mold molten metal runners 74', 74 and the in-mold atmosphere vent 75 to escape through the atmosphere vent 47.

As described above, in the double-sided wiring mold 77, the ceramic substrate 82 is tightly held by the substrate holding portion 94 provided on the joint face between the upper and lower molds 78, 79, and therefore, the floating of the ceramic substrate 82, which may occur as the third mold recessed portion 73 is filled with the molten metal 53, does not pose any particular problem. As the first and third mold recessed portions 62, 73 are filled with the molten metal 53, atmospheres in both of the recessed portions escape through the in-mold atmosphere vent 75.

When the first and third mold recessed portions 62, 73 are thus completely filled with the molten metal 53, the double-sided wiring mold 77 advances to the cooling part 31, where the cooling jacket 45 solidifies the molten metal 53 starting from the mold outlet 46 side. At this time, a strong force is given to the mold upper and lower faces 64, 65 due to the camber of the molten metal 53 that has started solidifying in the both of the recessed portions, but since the mold upper and lower faces 64, 65 are tightly held between the upper and lower guide rails 41, 42 respectively, the mold does not have to resist this camber only with its own strength. Similarly, no tool for fixing the upper and lower molds 78, 79 is required. Note that shrinkage cavity that is generated in accordance with the solidification of the molten metal 53 is induced to and generated in the opening portion 69 and the in-mold atmosphere vent 75 which serve also as the shrinkage cavity inducing portions, so that the generation of the shrinkage cavity in the metal-ceramic composite member with double-sided wiring joining metals can be avoided.

In the above-described manner, the metal-ceramic composite members with double-sided wiring joining metals can be successively manufactured. At this time, since the mold upper and lower faces 64, 65 do not require strength, they can be small-sized and light-weighted, so that the double-sided wiring mold 77 can be simple both in its external shape and internal structure, which facilitates the heating and cooling thereof. Consequently, it is made possible to improve productivity and to reduce mold manufacturing cost as well.

The metal-ceramic composite members according to the present invention as detailed above, particularly, the metal-ceramic composite member with cooling fin and so on can be processed into electronic members with electronic devices mounted thereon in such a manner that the circuit metal plate or the joining metal joined onto one side of the ceramic substrate is processed into a wiring material by etching or the like having a predetermined pattern to have electronic devices such as diodes, FET, and IGBT mounted thereon, and the metal plate, joining metal, or cooling fin joined onto the other side of the ceramic substrate is used as a cooling member.

In any of the metal-ceramic composite members according to the present invention, a joining strength between the ceramic substrate and the joining metal that is joined thereon is firm, so that the joining metal is not exfoliated even when being exposed to a high temperature, and further, the freedom degree in designing the cooling fin and so on is high, so that the aforesaid electronic members having the electronic devices mounted thereon are suitable for use in power electronics, electric automobiles, and so on dealing with high power.

EXAMPLE 1

As a mold, a carbon mold in substantially the same shape as that shown in FIG. 2 was used, the mold being so structured that the external dimension thereof was 100×250×17 mm; the dimension of a first mold recessed portion was 90.9×151.5×5 mm; in the second mold recessed portion, the dimension of a portion having the size corresponding to the size of a ceramic substrate to be placed therein was 40×40×

0.635 mm and the dimension of a portion having the size corresponding to the size of a metal plate to be disposed therein was 39×39×0.3 mm; the dimension of a shrinkage cavity inducing portion adjacent to the first mold recessed portion was 50×40×2 mm; and the second mold recessed portions were disposed at three places in the first mold recessed portion.

As a metal-ceramic brazed substrate, prepared was the one that was formed in such a manner that 20 μm of an active metal brazing material was applied on an aluminum nitride substrate with a dimension of 40×40×0.3 mm and a thickness of 0.635 mm, a copper plate with a thickness of 0.3 mm was placed thereon, and they were heated to the peak temperature 850° C. in a vacuum atmosphere to be braze-joined together. Then, a wiring pattern was resist-printed on this metal-ceramic breed substrate in which the copper plate was brazed, and etching was conducted to process the copper plate into a predetermined circuit form having a dimension of 39×39×0.3 mm.

In the joining furnace, the atmosphere was set to a nitrogen atmosphere of 1 atm, aluminum was used as a molten metal, the temperature of the atmosphere replacing/heating part was set to 700° C., the temperature of the molten-metal push-out part was set to 740° C., the temperature of the cooling part was set to 700° C., and the temperature of the cooling jacket was set to 50° C. The piston to press the molten metal was given a 500 g load, and the pouring time was set to 20 seconds.

After the temperature of each of the parts in the joining furnace and the molten metal were checked, three dummy molds were first inserted into the joining furnace, and the molds each having the aforesaid metal-ceramic brazed substrates placed therein were successively inserted. The inserting rate of one mold/minute was attained.

As a result, metal-ceramic composite members in each of which three metal-ceramic brazed substrates were joined onto the aluminum base plate having the dimension of 90×150×5 mm were obtained. The joint portions of the metal-ceramic composite members were free from defect and had sufficient joining strength.

EXAMPLE 2

Metal-ceramic composite members were manufactured under the same conditions as in Example 1, except that, in the joining furnace, the temperature of the atmosphere replacing/heating part was set to 740° C., the temperature of the molten-metal push-out part was set to 740° C., and the temperature of the cooling part was set to 600° C.

The mold inserting rate of one mold/minute was attained.

The joint portions of the obtained metal-ceramic composite members were free from defect and had sufficient joining strength.

EXAMPLE 3

Metal-ceramic composite members were manufactured under the same conditions as in Example 1, except that, as a mold, a carbon mold in substantially the same shape as that shown in FIG. 2 but with a structure described below was used and that a copper-alumina directly joined substrate was used instead of the metal-ceramic brazed substrate, the mold being so structured that the external dimension thereof was 100×150×17 mm, the dimension of a first mold recessed portion was 50.5×90.9×4 mm, the dimension of a second mold recessed portion was 40×60×0.25 mm, the dimension of a third mold recessed portion was 39×59×0.3 mm, the dimension of a shrinkage cavity inducing portion adjacent to the first mold recessed portion was 30×40×2 mm, the second and third mold recessed portions were provided at one place in the first mold recessed portion.

The mold inserting rate of one mold/minute was attained.

The joint portions of the obtained metal-ceramic composite members were free from defect and had sufficient joining strength.

Incidentally, the aforesaid copper-alumina directly joined substrate was prepared that was formed in such a manner that a copper plate with a thickness of 0.3 mm was placed on an alumina substrate with a thickness of 0.25 mm and they were heated at the peak temperature 1060° C. in a nitrogen atmosphere to be directly joined together. Then, a wiring pattern was resist-printed on this directly joined copper plate, and the copper plate was further etched to be processed into a circuit form having a predetermined dimension of 39×59×0.3 mm.

EXAMPLE 4

Metal-ceramic composite members were manufactured under the same conditions as in Example 1, except that, as a mold, a carbon mold in substantially the same shape as that shown in FIG. 2 but with a structure described below was used and that five pieces of copper-silicon nitride brazed substrates were placed, the mold being so structured that the external dimension thereof was 100×350×17 mm, the dimension of a first mold recessed portion was 90.9×252.5×5 mm; the dimension of a second mold recessed portion was 40×20×0.25 mm; the dimension of a third mold recessed portion was 30×19×0.3 mm; and the dimension of a shrinkage cavity inducing portion adjacent to the first mold recessed portion was 50×60×2 mm, the second and third mold recessed portions were provided at five places in the first mold recessed portion.

The mold inserting rate of one mold/minute was attained.

The joint portions of the obtained metal-ceramic composite member were free from defect and had sufficient joining strength.

EXAMPLE 5

Metal-ceramic composite members were manufactured under the same conditions as in Example 1, except that, as a mold, a carbon mold in substantially the same shape as that shown in FIG. 6A and FIG. 6B was used, the mold being so structured that the external dimension thereof was 100×250×50 mm, the dimension of a first mold recessed portion was 90.9×151.5×5 mm, the dimension of a second mold recessed portion was 40×40×0.635 mm, the dimension of a third mold recessed portion was 39×39×0.3 mm, the dimension of a shrinkage cavity inducing portion adjacent to the first mold recessed portion was 50×40×2 mm, second and third mold recessed portions were provided at three places in the first mold recessed portion, an in-mold molten metal runner with a diameter of 2 ϕ was provided, and the width of a fin portion was 2 mm.

The mold inserting rate of one mold/minute was attained.

As a result, metal-ceramic composite members were obtained, each being so structured that three metal-ceramic brazed substrates were joined onto an aluminum base plate with fin having a dimension of 90×150×30 mm. The joint portions of the metal-ceramic composite members were free from defect and had sufficient joining strength.

EXAMPLE 6

Metal-ceramic composite members were manufactured under the same conditions as in Example 1, except that, as a mold, a carbon wiring mold in substantially the same shape as that shown in FIG. 8 was used and that an aluminum nitride substrate having a dimension of 40×40×0.635 mm was used instead of the metal-ceramic brazed substrate, the mold being so structured that the external dimension thereof was 100×250×17 mm, the dimension of a first mold recessed portion was 90.9×151.5×15 mm, the dimension of a second mold recessed portion was 40×40×0.635 mm, the dimension of a third mold recessed portion was 39×39×0.4 mm, the dimension of a shrinkage cavity inducing portion adjacent to the first mold recessed portion was 50×40×2 mm, the second and third mold recessed portions were provided at three places in the first mold recessed portion, and an in-mold molten metal runner with a diameter of 2 $\phi$ was provided.

The mold inserting rate of one mold/minute was attained.

As a result, metal-ceramic composite members were obtained, each being so structured that three ceramic substrates were joined onto an aluminum base plate having a dimension of 90×150×5 mm and aluminum having a dimension of 39×39×0.4 mm was joined onto each of the ceramic substrates. The joint portions of the metal-ceramic composite members were free from defect and had sufficient joining strength.

EXAMPLE 7

Metal-ceramic composite members were manufactured under the same conditions as in Example 1, except that, as a mold, a carbon wiring mold in substantially the same shape as that shown in FIG. 8 was used and that an alumina substrate having a dimension of 40×60×0.25 mm was used instead of the metal-ceramic brazed substrate, the mold being so structured that the external dimension thereof was 100×150×17 mm, the dimension of a first mold recessed portion was 50.5×90.9×4 mm, the dimension of a second mold recessed portion was 40×60×0.25 mm, the dimension of a third mold recessed portion was 39×59×0.3 mm, the dimension of a shrinkage cavity inducing portion adjacent to the first mold recessed portion was 30×40×2 mm, the second and third mold recessed portions were provided at one place in the first mold recessed portion, and an in-mold molten metal runner with a diameter of 2 $\phi$ was provided.

The mold inserting rate of one mold/minute was attained.

As a result, metal-ceramic composite members were obtained, each being so structured that one ceramic substrate was joined onto an aluminum base plate having a dimension of 50×90×4 mm and aluminum having a dimension of 39×59×0.3 mm was joined onto the ceramic substrate. The joint portions of the metal-ceramic composite members were free from defect and had sufficient joining strength.

EXAMPLE 8

Metal-ceramic composite members were manufactured under the same conditions as in Example 1, except that, as a mold, a carbon wiring mold in substantially the same shape as that shown in FIG. 8 was used and that a silicon nitride substrate having a dimension of 40×20×0.32 mm was used instead of the metal-ceramic brazed substrate, the mold being so structured that the external dimension thereof was 100×350×17 mm, the dimension of a first mold recessed portion was 90.9×252.5×5 mm, the dimension of a second mold recessed portion was 40×20×0.25 mm, the dimension of a third mold recessed portion was 39×19×0.4 mm, the dimension of a shrinkage cavity inducing portion adjacent to the first mold recessed portion was 50×60×2 mm, the second and third mold recessed portions were provided at five places in the first mold recessed portion, and an in-mold molten metal runner with a diameter of 2 $\phi$ was provided.

The mold inserting rate of one mold/minute was attained.

As a result, metal-ceramic composite members were obtained, each being so structured that five ceramic substrates were joined onto an aluminum base plate having a dimension of 90×252×5 mm and aluminum having a dimension of 39×19×0.4 mm was joined onto each of the ceramic substrates. The joint portions of the metal-ceramic composite members were free from defect and had sufficient joining strength,

EXAMPLE 9

Metal-ceramic composite members were manufactured under the same conditions as in Example 1, except that, as a mold, a carbon mold in substantially the same shape as that shown in FIG. 10A and FIG. 10B was used and that an aluminum nitride substrate having a dimension of 40×40×0.635 mm was used instead of the metal-ceramic brazed substrate, the mold being so structured that the external dimension thereof was 100×250×50 mm, the dimension of a first mold recessed portion was 90.9×151.5×5 mm, the dimension of a second mold recessed portion was 40×40×0.635 mm, the dimension of a third mold recessed portion was 39×39×0.635 mm, the dimension of a shrinkage cavity inducing portion adjacent to the first mold recessed portion was 50×40×2 mm, the second and third mold recessed portions were provided at three places in the first mold recessed portion, an in-mold molten metal runner with a diameter of 2 $\phi$ was provided, and a fin portion had a width of 2 mm.

The mold inserting rate of one mold/minute was attained.

As a result, metal-ceramic composite members were obtained, each being so structured that three ceramic substrates were joined onto an aluminum base plate having a dimension of 90×150×30 mm and aluminum having a dimension of 39×39×0.4 mm was joined onto each of the ceramic substrates. The joint portions of the metal-ceramic composite members were free from defect and had sufficient joining strength.

EXAMPLE 10

Metal-ceramic composite members were manufactured under the same conditions as in Example 1, except that, as a mold, a carbon double-sided wiring mold in substantially the same shape as that shown in FIG. 12 was used and that an aluminum nitride substrate having a dimension of 80×90×0.635 mm was used instead of the metal-ceramic brazed substrate, the mold being so, structured that the external dimension thereof was 100×150×14 mm, the dimension of a first and a third mold recessed portion was 78×80×0.4 mm, the dimension of a substrate holding portion was 80×90×0.635 mm, the first and third mold recessed portions were provided at one place in the mold, and an in-mold molten metal runner with a diameter of 2 $\phi$ was provided.

The mold inserting rate of one mold/minute was attained.

As a result, metal-ceramic composite members were obtained, each being so structured that aluminum having a dimension of 78×80×0.4 mm was joined onto-front and rear faces of the ceramic substrate. The joint portions of the metal-ceramic composite members were free from defect and had sufficient joining strength.

EXAMPLE 11

Metal-ceramic composite members were manufactured under the same conditions as in Example 1, except that, as a mold, a carbon double-sided wiring mold in substantially the same shape as that shown in FIG. 12 was used and that an alumina substrate having a dimension of 70×80×0.25 mm was used instead of the metal-ceramic brazed substrate, the mold being so structured that the external dimension thereof was 100×150×14 mm, the dimension of a first and a third mold recessed portion was 68×78×0.4 mm, the dimension of a substrate holding portion was 70×80×0.25 mm, the first and third mold recessed portions were provided at one place in the mold, and an in-mold molten metal runner with a diameter of 2 φ was provided.

The mold inserting rate of one mold/minute was attained.

As a result, metal-ceramic composite members were obtained, each being so structured that aluminum having a dimension of 68×78×0.4 mm was joined onto front and rear faces of the ceramic substrate. The joint portions of the metal-ceramic composite members were free from defect and had sufficient joining strength.

As is detailed above, the present invention is a manufacturing apparatus of a metal-ceramic composite member that joins a metal onto the surface of a ceramic member by a direct joining strength of a ceramic and a metal on an interface therebetween in such a manner that the ceramic member is placed in a mold member, a molten metal to be joined is poured into the mold member so as to be in contact with the surface of the ceramic member, and the molten metal is cooled and solidified, and the manufacturing apparatus comprises:

a plurality of process regions; and a passage member extending along the plural process regions, that allows the mold member to pass therethrough, the molten metal to be joined being poured while the mold member is passing through the passage member practically in a shielded state from the atmosphere.

The use of this manufacturing apparatus makes it possible to perform heating, molten-metal pouring, and cooling while the mold member having the ceramic member placed therein is passing through the passage member practically in a shielded state from the atmosphere, and makes it possible for the plural mold members to pass through the passage member, being contiguous to one another, and moreover, since the molten metal to be joined is poured to the mold member, the time for melting the metal is not required and the mold member itself can be downsized, resulting in the reduction in the heating and cooling time, so that productivity of the metal-ceramic composite member has been greatly improved.

What is claimed is:

1. A method for manufacturing a metal-ceramic composite member, comprising:

placing a ceramic member in a movable mold member;

pouring a molten metal to be joined into the movable mold member which is disposed inside a fixed passage member so as to bring the molten metal into contact with a surface of the ceramic member; and cooling and solidifying the molten metal to join the metal onto the surface of the ceramic member by a direct joining strength of the ceramic and the metal on an interface therebetween, wherein the molten metal to be joined is poured while the movable mold member is passing through a passage member, with the ceramic member placed in the movable mold member, extending along a plurality of process regions, practically in a shielded state from the atmosphere.

2. A method for manufacturing a metal-ceramic composite member according to claim 1, wherein the solidification is made to progress in one direction when the molten metal is cooled and solidified.

3. A method for manufacturing a metal-ceramic composite member according to claim 1, wherein the metal is aluminum or an alloy essentially consisting of aluminum, and wherein the ceramic member is any one of an oxide, a nitride, and a carbide of aluminum, and an oxide, a nitride, and a carbide of silicon.

* * * * *